(12) United States Patent
Andresen et al.

(10) Patent No.: US 9,936,588 B2
(45) Date of Patent: Apr. 3, 2018

(54) PRINTED CIRCUIT BOARD HAVING A NON-PLATED HOLE WITH LIMITED DRILL DEPTH

(71) Applicant: Lenovo Enterprise Solutions (Singapore) Pte. Ltd., Singapore (SG)

(72) Inventors: Mark E. Andresen, Cary, NC (US); Virginia Ott, Apex, NC (US)

(73) Assignee: Lenovo Enterprise Solutions (Singapore) Ptd. Ltd., Singapore (SG)

( * ) Notice: Subject to any disclaimer, the term of this patent is extended or adjusted under 35 U.S.C. 154(b) by 1036 days.

(21) Appl. No.: 13/655,135

(22) Filed: Oct. 18, 2012

(65) Prior Publication Data

US 2013/0038998 A1    Feb. 14, 2013

Related U.S. Application Data

(62) Division of application No. 12/630,677, filed on Dec. 3, 2009, now Pat. No. 8,365,399.

(51) Int. Cl.
*H05K 3/30* (2006.01)
*H05K 3/00* (2006.01)

(52) U.S. Cl.
CPC ........... *H05K 3/308* (2013.01); *H05K 3/0047* (2013.01); *H05K 2201/044* (2013.01); *H05K 2201/09509* (2013.01); *H05K 2201/10303* (2013.01); *H05K 2201/10545* (2013.01); *H05K 2201/10871* (2013.01); *H05K 2203/0207* (2013.01); *Y10T 29/4913* (2015.01); *Y10T 29/49144* (2015.01); *Y10T 29/49147* (2015.01); *Y10T 29/49165* (2015.01)

(58) Field of Classification Search
CPC ...................................... H05K 3/308
USPC ............................ 361/788, 679.33, 783, 760
See application file for complete search history.

(56) References Cited

U.S. PATENT DOCUMENTS

| | | | |
|---|---|---|---|
| 4,247,981 A | 2/1981 | Walters | |
| 5,264,975 A | 11/1993 | Bajorek et al. | |
| 5,793,998 A * | 8/1998 | Copeland et al. | 710/305 |
| 6,409,159 B1 | 6/2002 | Asai et al. | |
| 6,457,495 B1 * | 10/2002 | Meheen | 141/40 |
| 6,590,165 B1 * | 7/2003 | Takada et al. | 174/266 |
| 6,721,821 B1 | 4/2004 | Rent | |
| 6,991,960 B2 | 6/2006 | Howarth | |
| 7,471,510 B2 | 12/2008 | He | |

(Continued)

OTHER PUBLICATIONS

Gisin, Franz et al. "Overview of Backdrilling", Sanmina-SCI, 5 pages.

(Continued)

*Primary Examiner* — Andargie M Aychillhum
(74) *Attorney, Agent, or Firm* — Jeffrey L. Streets

(57) ABSTRACT

A printed circuit board having one or more holes that are controllably drilled to extend into the printed circuit board substrate to a predetermined depth intermediate first and second faces. A mechanical locating pin is received into each of the one or more holes to mechanically align a first component for electronically interfacing with the printed circuit board substrate. A second component is installed on the second face directly opposite of the one or more holes such that the second component is in electronic communication with conductive traces or interconnects formed on the second face directly opposite of the hole.

8 Claims, 2 Drawing Sheets

(56) References Cited

U.S. PATENT DOCUMENTS

2004/0144564 A1     7/2004  Hoffmann
2005/0263322 A1*   12/2005  Mickievicz et al. .......... 174/260
2006/0215379 A1*    9/2006  Zollo et al. ................... 361/761
2008/0127484 A1     6/2008  Tourne

OTHER PUBLICATIONS

Best et al. "High Speed, Small Diameter Disk Storage System", U.S. Statutory Invention Registration No. H1221, Aug. 3, 1993, pp. 1-32.

* cited by examiner

PRINTED CIRCUIT BOARD HAVING A NON-PLATED HOLE WITH LIMITED DRILL DEPTH

CROSS-REFERENCE TO RELATED APPLICATIONS

This application is a divisional of co-pending U.S. patent application Ser. No. 12/630,677, filed on Dec. 3, 2009.

BACKGROUND

1. Field of the Invention

The present invention relates to printed circuit boards having components secured to opposing sides.

2. Background of the Related Art

Printed circuit boards are used as the primary platform upon which a computer hardware system is constructed. Integrated circuits, power sources, input/output devices, and other component subsystems within a given compute node communicate with each other through one or more printed circuit boards. The primary printed circuit board in a compute node, along with the component secured to board, is commonly referred to as a motherboard. A secondary printed circuit board that expands the functionality of the motherboard is referred to as a daughter card.

In a multi-node chassis, a printed circuit board referred to as a midplane is also used to provide means of communication between multiple compute nodes and various chassis resources, such as a network switch, a management controller, a power supply, and a computer readable storage device. In a storage subsystem, multiple computer readable storage devices, such as disk drives, may be coupled to a printed circuit board referred to as a backplane. Ideally, the backplane will accommodate a large number of disk drives on a tight pitch. However, arranging disk drives closely together on the backplane presents a problem with component placement and signal routing due to the mechanical through-hole locating pins associated with the drive connectors.

Presently, the placement of components on the backplane is accommodated in several different ways. First, the number of disk drives may be reduced to provide additional pitch or spacing between the locating pins for component placement. However, the reduced number of disk drives also provides reduced system storage capacity and performance. In a second approach, the mechanical locating pins are no longer used such that disk drives must rely upon other means for aligning with the backplane. Unfortunately, removing the locating pins presents a manufacturing problem with holding the connector alignment relative to the mechanical enclosure that supports the drive. For example, this causes a particular problem during surface mount solder reflow process. In a further approach, a daughter board may be added to secure additional components. Still, adding daughter cards, connectors and mounting hardware to the system increases the cost of the system, while also presenting challenges to airflow and packaging issues.

BRIEF SUMMARY

One embodiment of the present invention provides a printed circuit board comprising a planar substrate having a first face, a second face opposite the first face, and a plurality of conductive layers disposed between nonconductive layers. A plurality of holes extend into the planar substrate from the first face to a predetermined depth intermediate the first and second faces, wherein the hole extends through a first subset of the conductive layers but does not extend through a second subset of the conductive layers. The printed circuit board further comprises a plurality of mechanical locating pins, wherein each pin is received into one of the plurality of holes to mechanically align a first component for electronically interfacing with the planar substrate. A second component is installed on the second face directly opposite of the hole; wherein the second component is in electronic communication with conductive traces or interconnects formed on the second face directly opposite of the hole.

DETAILED DESCRIPTION

Figure 1:
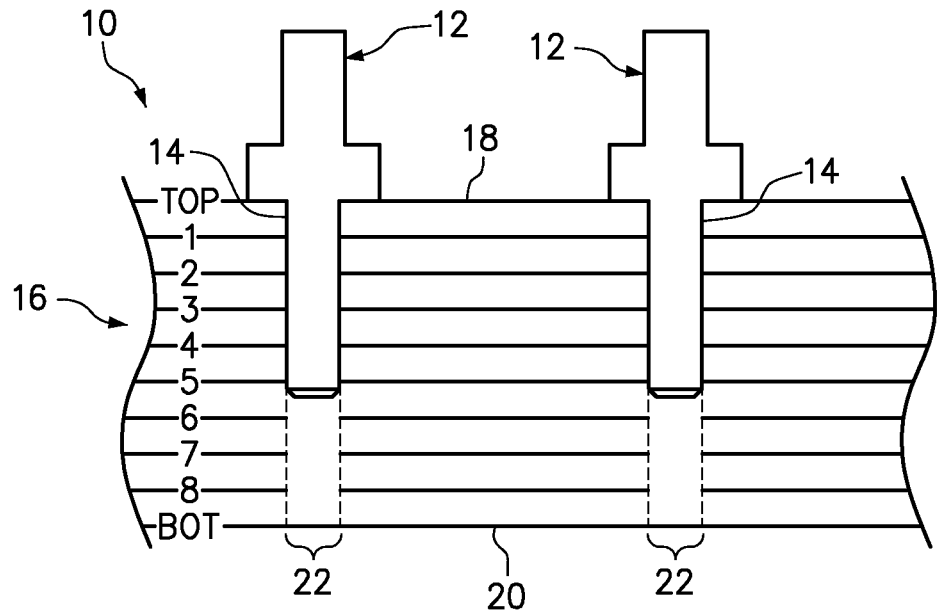
FIG. 1 is a cross-sectional diagram of a printed circuit board having mechanical locating pins received in a pair of through holes in accordance with the prior art.

One embodiment of the present invention provides a printed circuit board comprising a planar substrate having a first face, a second face opposite the first face, and a plurality of conductive layers disposed between nonconductive layers. A plurality of holes extend into the planar substrate from the first face to a predetermined depth intermediate the first and second faces, wherein the plurality of holes extends through a first subset of the conductive layers but does not extend through a second subset of the conductive layers. The printed circuit board further comprises a plurality of mechanical locating pins, wherein each pin is received into one of the plurality of holes to mechanically align a first component for electronically interfacing with the planar substrate. A second component is installed on the second face directly opposite of at least one of the holes, wherein the second component is in electronic communication with conductive traces or interconnects formed on the second face directly opposite of the at least one of the holes.

The planar substrate may include various types of conductive layers, such as ground planes, power planes, and layer having various conductive traces and features. Plated through-holes or vias may extend between conductive layers in order to selectively couple conductive features on one layer with conductive features on another layer. For example, a component installed on a first face of the planar substrate may be electronically coupled to a power plane through a first via in order to extend electrical power to the component and electronically coupled to a ground plane through a second via. Still further, conductive traces may allow input and output signals to and from the component. The multiple conductive layers of the substrate enable routing of signals through various layers and in various directions to accommodate the various components installed on the printed circuit board.

Optionally, the printed circuit board may be a motherboard, daughter board, expansion card, midplane or backplane. For example, where the printed circuit board is a midplane or backplane, there is a particular need to install components on both sides of the board in order to accommodate the various components that may be coupled thereto. The first component may be a disk drive and the printed circuit board may provide mechanical locating pins to receive a plurality of disk drives with close spacing across a first face of the circuit board. In accordance with the invention, components may still be installed on a second face of the circuit board directly opposite at least one of the holes used to align and install the first component.

The second component, which is installed on the second face directly opposite the holes, may be any type of component that is adapted to be coupled to a printed circuit board. Most preferably, the second component is a surface mounted component, such as an integrated circuit in electronic communication with the conductive traces or interconnects through a ball grid array or pin grid array. The limited depth of the holes in accordance with the present invention enables the placement of conductive traces, interconnects and pad arrays as necessary to support a ball grid array, pin grid array or other connections. By contrast, the prior art through holes disrupted the second face and prevented conductive traces, interconnects and pad arrays from being formed in the area where the through holes came through the second face.

The holes in accordance with the present invention may extend to any predetermined depth so long as the hole terminates intermediate the first and second faces and can receive a locating pin that positions the first component along the first face. In a preferred embodiment, the hole extends through less than or equal to half of the conductive layers in the substrate. For example, in a printed circuit board having eight conductive layers within the planar substrate (i.e., not including any conductive features on the first and second faces of the substrate), the hole may extend to a depth that passes through the four conductive layers closest to the first face. Accordingly, the printed circuit board is preferably designed so that conductive features in these four layers are routed around the area where the hole will be drilled. By carefully controlling the depth of the hole, the layout of conductive features within the remaining four conductive layers closest to the second face may be designed without regard to the holes.

In a further embodiment of the invention, the first component is mechanically engaged with one or more of the mechanical locating pins and electronically interfaced with the planar substrate. For example, a disk drive may be aligned with the mechanical locating pins and positioned so that a disk drive connector is coupled to a connector on the first face of the printed circuit board. Accordingly, the disk drive is operably positioned for input and output with respect to components associated with the printed circuit board.

Another embodiment of the present invention provides a method of connecting components to a printed circuit board. The method comprises forming a printed circuit board having a first face, a second face opposite the first face, and a plurality of conductive layers disposed between nonconductive layers. A hole is drilled into the first face of the printed circuit board to a predetermined depth intermediate the first and second faces, wherein the hole extends through a first subset of the conductive layers but does not extend with a second subset of the conductive layers. A mechanical locating pin is inserted into the hole to help align and install a first component along the first face. Because the holes have limited depth and do not extend completely through the printed circuit board, a second component is able to be installed on the second face directly opposite of the hole, wherein the second component is in electronic communication with conductive traces or interconnects formed on the second face directly opposite of the hole. The method may be performed with the components and features described above in reference to a printed circuit board.

In yet another embodiment, the method may include drilling a plurality of the holes in the first face of the printed circuit board and installing a plurality of components along the first face by inserting mechanical locating pins into the plurality of holes. For example, the pins may have a retention feature built in to the mechanical locating pins, such as a hollow slotted pin that compresses firmly into the hole. In a preferred embodiment, the plurality of components includes disk drives and the plurality of holes are arranged to align the plurality of disk drives in a compact arrangement.

FIG. 1 is a cross-sectional diagram of a printed circuit board 10 having mechanical locating pins 12 received in a pair of through holes 14 in accordance with the prior art. The through holes 14 extend completely through the substrate 16 from a first face 18 to a second face 20. Accordingly, conductive features in the conductive layers 1 to 8, as well as conductive features on the first face 18 and second face 20, must be routed around the area of the holes 14. Furthermore, electrical connections to the printed circuit board must be kept out of the areas 22 where the holes 14 come through the second face 20. Depending upon the size of the components that need to be installed on the second face 20, the area between the holes may also be insufficient to provide the necessary electrical connections.

Figure 2:
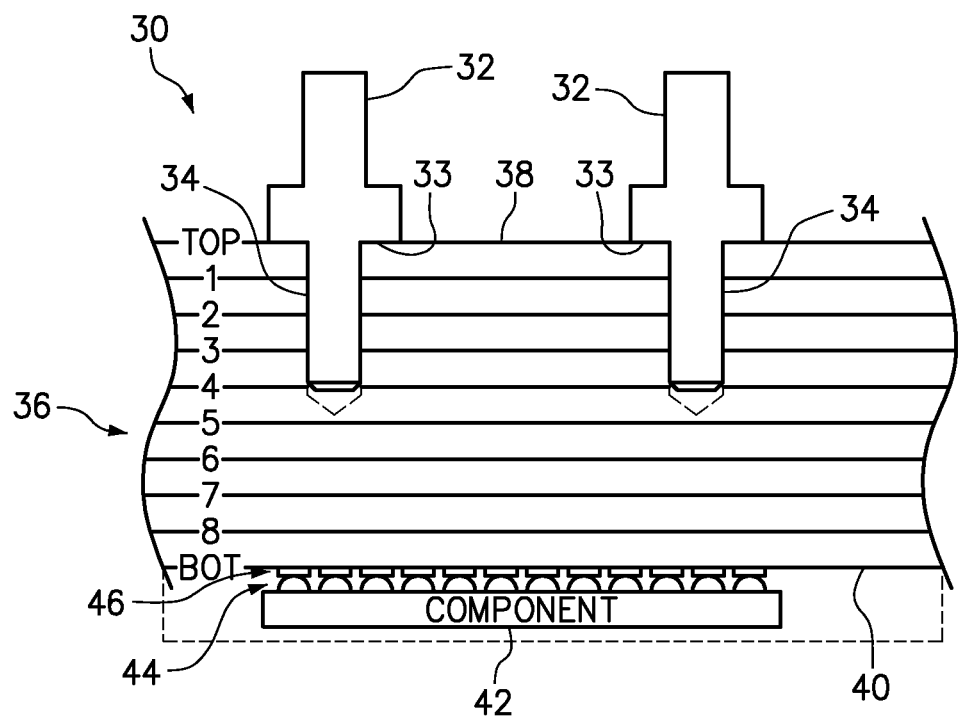
FIG. 2 is a cross-sectional diagram of a printed circuit having mechanical locating pins received in a pair of holes having a limited depth in accordance with the present invention.

FIG. 2 is a cross-sectional diagram of a printed circuit board 30 having mechanical locating pins 32 received in a pair of holes 34 having a limited depth in accordance with the present invention. The holes 34 extend into the substrate 36 a predetermined distance to a depth that is intermediate between a first face 38 and a second face 40. Accordingly, conductive features in the conductive layers 1 to 4, as well as conductive features on the first face 38, are routed around the area of the holes 34. However, the conductive layers 5 to 8, as well as conductive features on the second face 40, are unaffected by the holes 34 and conductive features in those layers may be routed in the area directly opposite (i.e., in alignment with) the holes 34.

Furthermore, one or more component, such as component 42, may be installed in the area directly opposite the holes 34 and make electrical connections to the conductive features on the second face 40 directly opposite the holes. Since the holes do not penetrate the second face 40, the entire area of the second face 40 is available for conductive features and connections with a component. Still further, component size and placement may be determined based upon typical design principles without the constraints imparted by the through holes of the prior art. As shown, the component 42 is an integrated circuit, such as an application specific integrated circuit (ASIC), having a ball grid array 44 coupled to a mating pad array 46 on the second face of the substrate.

Each mechanical locating pin 32 preferably has a first end that extends to a point near the distal end of one of the holes 34. The pin 32 preferably also includes a shoulder or flange 33 that rests on the first face of the substrate 36, serving to control the depth that the first end extends into the hole as well as stabilizing the pin. A second end of the pin 32 extends outward from the first face 38 to cooperate with and position a component, such as a disk drive, to be installed along the first face. Optionally, two or more pins may be provided by a single component, such as a connector housing that extends between two pins. For example, the connector may be a serial attached SCSI connector.

Figure 3:
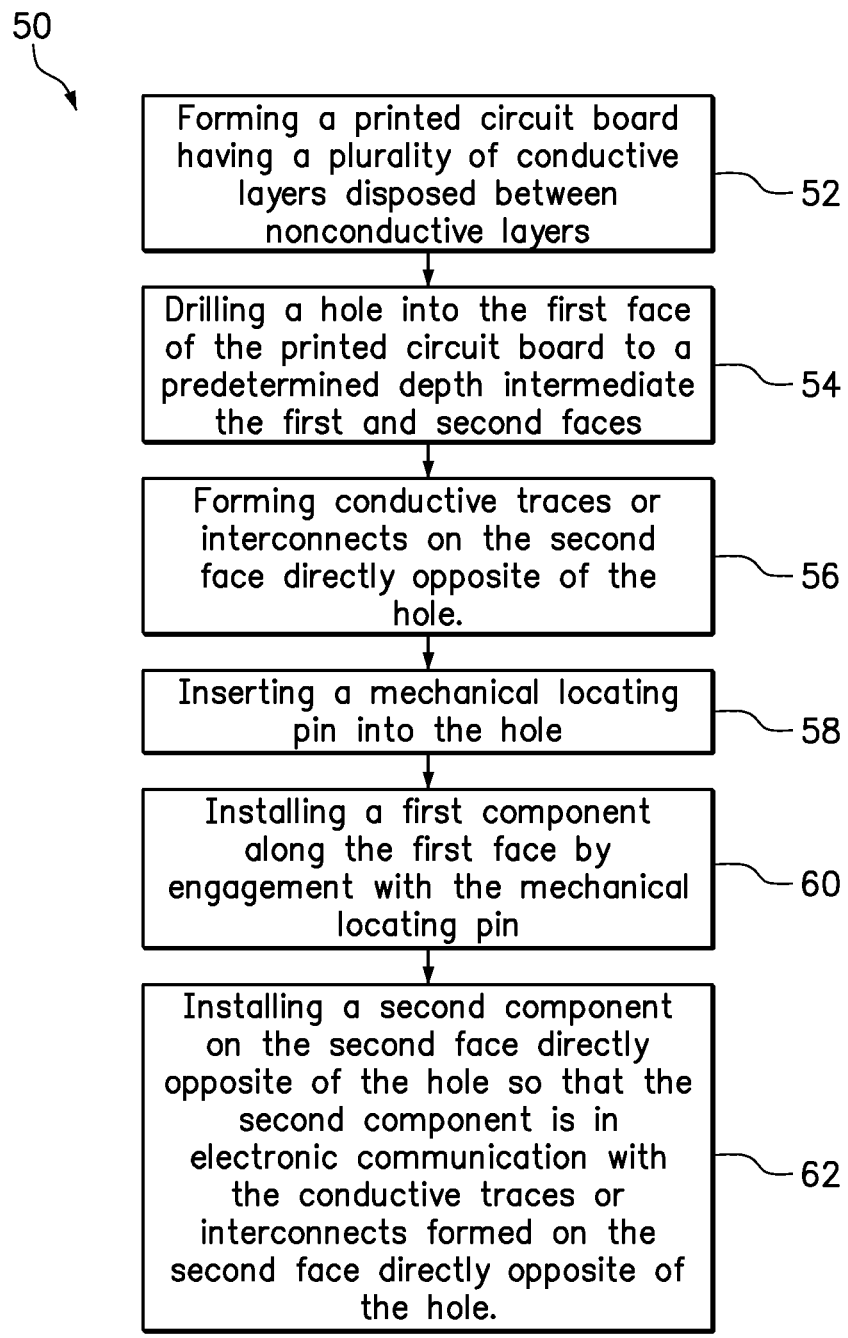
FIG. 3 is a flowchart of a method for making a printed circuit board.

FIG. 3 is a flowchart of a method 50 for making a printed circuit board. In step 52, the method includes forming a printed circuit board having a plurality of conductive layers disposed between nonconductive layers. Step 54 provides for drilling a hole into the first face of the printed circuit board to a predetermined depth intermediate the first and second faces. In step 56, conductive traces or interconnects are formed on the second face directly opposite of the hole.

A mechanical locating pin is inserted into the hole in step 58, and a first component is installed along the first face by engagement with the mechanical locating pin in step 60. In step 62, a second component is installed on the second face directly opposite of the hole so that the second component is in electronic communication with the conductive traces or interconnects formed on the second face directly opposite of the hole.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon, such as an application program for designing the layout (i.e., modeling and/or automated manufacturing) of a printed circuit board.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A printed circuit board, comprising:
   a planar substrate having a first face, a second face opposite the first face, and a plurality of conductive layers disposed between nonconductive layers of the planar substrate;
   a plurality of holes extending into the planar substrate from the first face to a predetermined depth intermediate the first and second faces, wherein the hole extends through a first subset of the conductive layers but does not extend through a second subset of the conductive layers;
   a plurality of mechanical locating pins, each pin received into one of the plurality of holes, wherein the mechanical locating pin is disposed to mechanically align a first component for electronically interfacing with the planar substrate; and
   a second component on the second face directly opposite of the hole, wherein the second component is in electronic communication with conductive traces or interconnects formed on the second face directly opposite of the hole.

2. The printed circuit board of claim 1, wherein the printed circuit board is a backplane.

3. The printed circuit board of claim 1, wherein the first component is a disk drive.

4. The printed circuit board of claim 1, wherein the second component is an integrated circuit in electronic communication with the conductive traces or interconnects through a ball grid array.

5. The printed circuit board of claim 1, wherein the second component is an integrated circuit in electronic communication with the conductive traces or interconnects through a pin grid array.

6. The printed circuit board of claim 1, wherein the hole extends through less than or equal to half of the conductive layers in the substrate.

7. The printed circuit board of claim 1, further comprising:
   the first component mechanically engaged with one or more of the mechanical locating pins and electronically interfaced with the planar substrate.

8. The printed circuit board of claim 7, wherein the first component is a disk drive.

* * * * *